(12) United States Patent
Song et al.

(10) Patent No.: US 6,967,151 B2
(45) Date of Patent: Nov. 22, 2005

(54) METHOD OF MANUFACTURING A SEMICONDUCTOR DEVICE

(75) Inventors: Pil Geun Song, Seoul (KR); Sang Wook Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/872,883

(22) Filed: Jun. 21, 2004

(65) Prior Publication Data

US 2005/0142711 A1    Jun. 30, 2005

(30) Foreign Application Priority Data

Dec. 30, 2003    (KR) .................... 10-2003-0100171

(51) Int. Cl.$^7$ ................ H01L 21/3205; H01L 21/4763
(52) U.S. Cl. .................. 438/587; 438/595; 438/689; 438/778
(58) Field of Search ................ 438/195–197, 438/265, 275, 303, 587, 591, 592, 595, 622, 438/689, 745, 756, 778, 781, 783, 787

(56) References Cited

U.S. PATENT DOCUMENTS

| | | | | | |
|---|---|---|---|---|---|
| 5,238,872 | A | * | 8/1993 | Thalapaneni | 438/453 |
| 5,422,295 | A | * | 6/1995 | Choi et al. | 438/254 |
| 5,766,991 | A | * | 6/1998 | Chen | 438/231 |
| 6,350,665 | B1 | * | 2/2002 | Jin et al. | 438/585 |

* cited by examiner

*Primary Examiner*—Asok Kumar Sarkar
(74) *Attorney, Agent, or Firm*—Marshall, Gerstein & Borun LLP

(57) ABSTRACT

Provided is a method of manufacturing a semiconductor device. In the method, an insulation spacer is formed thicker than a target thickness on sidewalls of a gate line formed on a semiconductor substrate. The thickness of the insulation spacer is adjusted by means of a wet etching process, so that aspect ratios of spaces between gate lines become smaller to control opening widths of junction areas. The method enhances fill-up characteristics of insulation layers between the gate lines, and improves the reliability of process and an electrical characteristic of device by controlling the opening widths of junction areas.

9 Claims, 6 Drawing Sheets

METHOD OF MANUFACTURING A SEMICONDUCTOR DEVICE

BACKGROUND

1. Technical Field

A method of manufacturing a semiconductor device with an improved fill characteristic of the insulation layer is disclosed.

2. Discussion of Related Art

As design rules go down to improve an integration density of a semiconductor device, a channel length of gate becomes shorter and a pitch between gates becomes narrower. With the narrower pitch between gates, it causes aspect ratios of spaces between gates to become higher.

The higher aspect ratios of spaces between gates causes degradation of a "fill-up" or fill characteristic between gates when an insulation layer is deposited thereon to form an interlayer insulating layer.

SUMMARY OF THE DISCLOSURE

Accordingly, a method of manufacturing a semiconductor device is disclosed wherein an insulation spacer is formed thicker than a target thickness on sidewalls of a gate line formed on a semiconductor substrate. The thickness of the insulation spacer is adjusted by means of a wet etching process, so that aspect ratios of spaces between gate lines become smaller to control opening widths of junction areas. The method enhances fill-up or fill characteristics of insulation layers between the gate lines, and improves the reliability of process and an electrical characteristic of device by controlling the opening widths of junction areas.

In the embodiment, a method of manufacturing a semiconductor device comprises: providing a semiconductor substrate; forming gate lines on the semiconductor substrate; forming junction areas in the semiconductor substrate around the gate lines; forming insulation spacers on sidewalls of the gate lines; enlarging opening widths of the junction areas by etching the insulation spacers; and forming an interlayer insulating layer on the overall structure including the gate lines.

In another aspect, a method of manufacturing a semiconductor device comprises: providing a semiconductor substrate; forming gate lines on the semiconductor substrate, wherein a first space and a second space narrower than the first space are provided between the gate lines; forming a first junction area in the semiconductor substrate under the first space and forming a second junction area in the semiconductor substrate under the second space; forming insulation spacers on sidewalls of the gate lines, wherein a portion of the first area is exposed and the second junction area is covered with the insulation spacers; etching the insulation spacers, wherein an opening width of the first junction area is enlarged; and forming an interlayer insulating layer on the overall structure including the gate lines.

In this embodiment, the insulation spacers are formed of a silicon oxide layer.

The etching is preferred to be carried out by means of a wet etching process, for which a diluted HF solution or a BOE solution may be used.

It is preferable for a proceeding time for the etching to be adjusted to make the insulation spacers be set on the target thickness in consideration of an etching ratio of the insulation spacers. The etching is carried out to etch the insulation spacers in order to make the opening widths of the junction areas be maximized while assuring a normal function of the insulation spacers. During this, the etching may be conducted to etch the insulation spacers in order to make the opening widths of the junction areas be wider to 10 nm through 1000 nm.

Before forming the interlayer insulating layer, it may be additionally carried out with the step of forming a nitride layer on the overall structure including the gate lines, in order to form borderless contacts.

The interlayer insulating layer is preferred to be formed of a BPSG which contains boron and phosphorous under ratios of 4.5 wt % and 4.0 wt %, respectively.

After forming the interlayer insulating layer, the step of carrying out a rapid thermal process may be further comprised to increase flexibility of the interlayer insulating layer.

DETAILED DESCRIPTION OF PREFERRED EMBODIMENTS

Preferred embodiments will be described below in more detail with reference to the accompanying drawings. The disclosed methods may, however, be embodied in different forms and should not be constructed as being limited to the embodiments set forth herein. Rather, these embodiments are provided so that this disclosure will be thorough and complete.

A description that a certain layer is "on" another layer or a semiconductor substrate is desired to be understood like that the certain layer is directly contact to said another layer or the semiconductor substrate, or like that a third layer is interposed between the certain layer and said another layer or the semiconductor substrate. And, in drawings, the dimensions or thicknesses for layers will be magnified for convenience of explanation and clearness. Like numerals refer to like elements throughout the specification.

Figure 3:
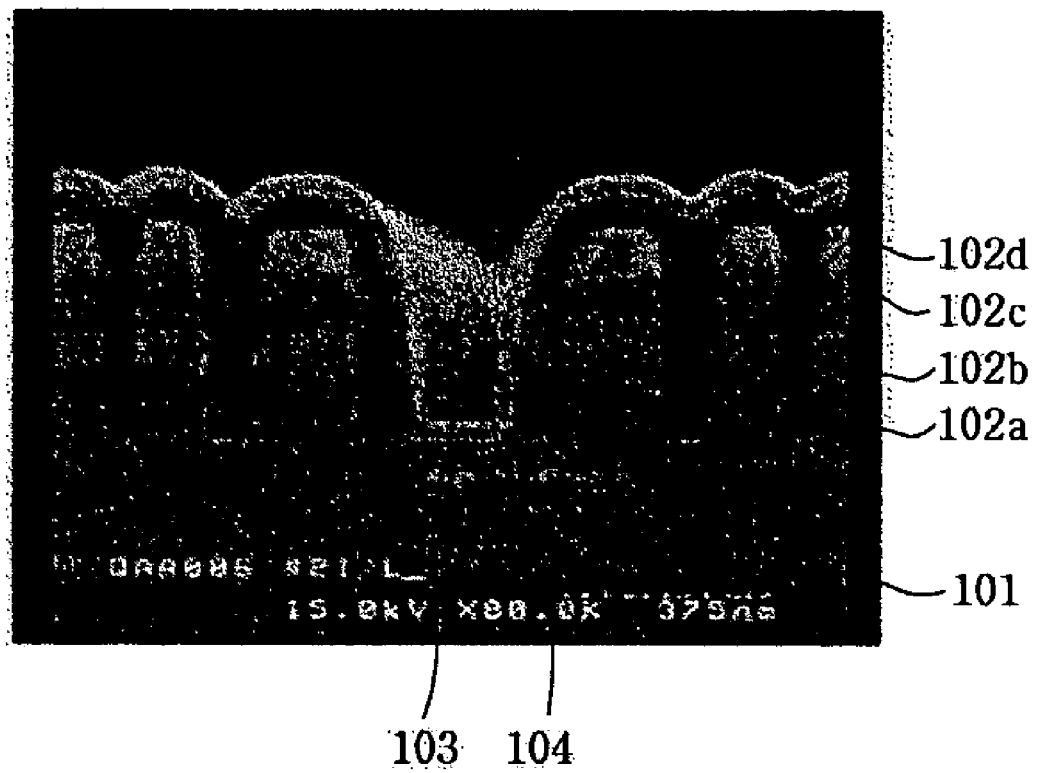
FIG. 3 is a microscopic view by SEM showing a section after etching the insulation spacers by a predetermined thickness.
Figure 4A:
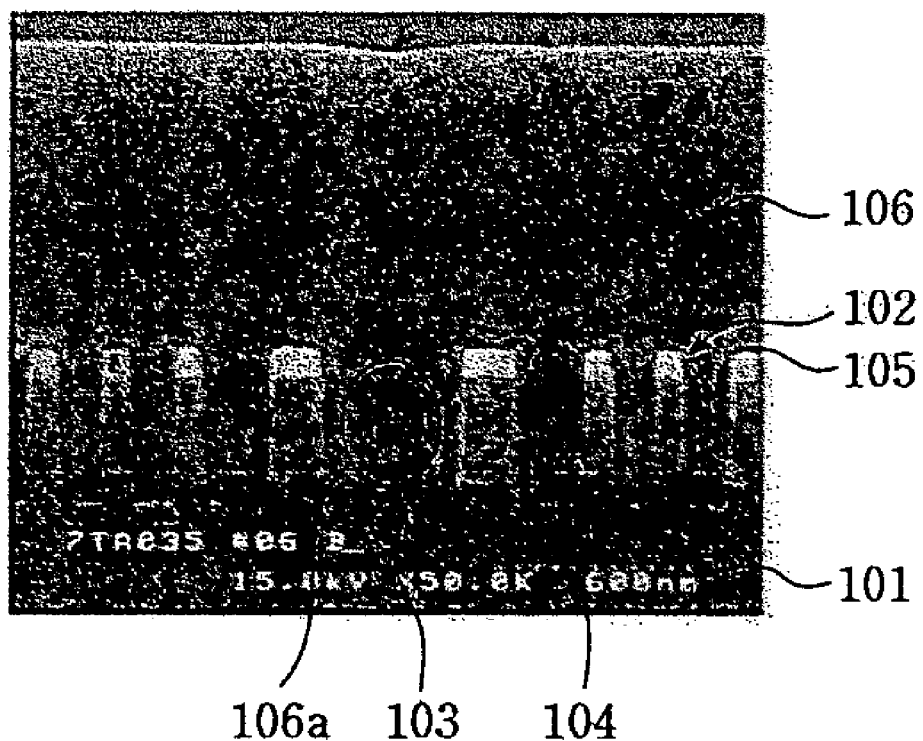
FIGS. 4A and 4B are microscopic views by SEM comparatively showing fill-up characteristics of the insulation layers in accordance with whether or not there is an etching process.
Figure 4B:
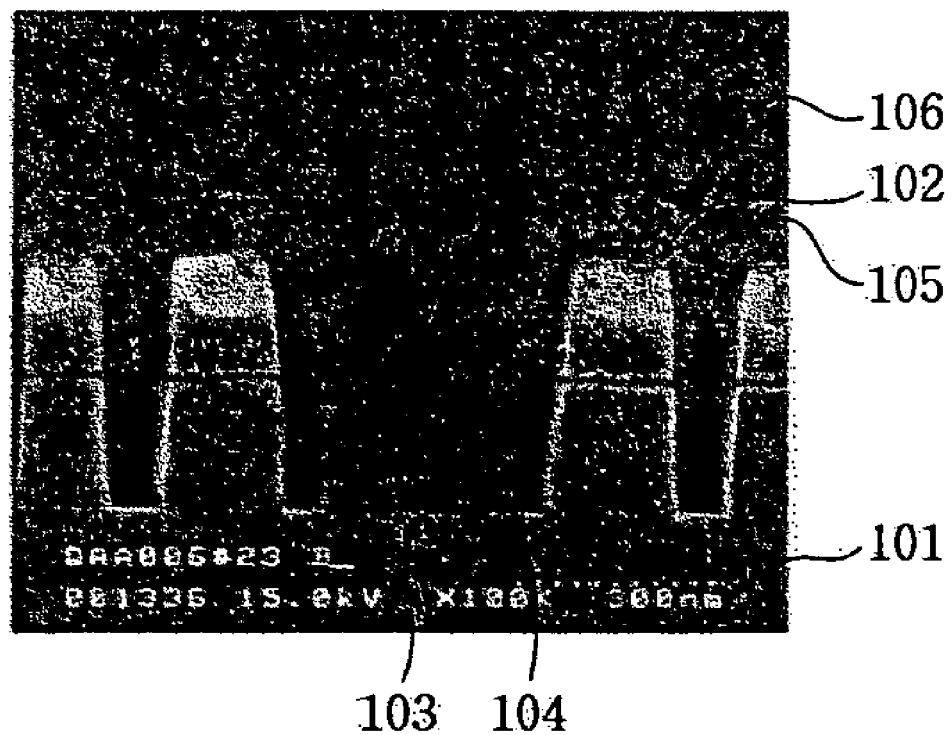

FIGS. 1A through 1D are sectional views illustrating a method of manufacturing a semiconductor device in accordance with an exemplary embodiment. FIG. 2 is a microscopic view showing a section before etching insulation spacers. FIG. 3 is a microscopic view showing a section after etching the insulation spacers by a predetermined thickness. FIGS. 4A and 4B are microscopic views comparatively showing fill-up characteristics of the insulation layers in accordance with whether or not there is an etching process.

Figure 1A:
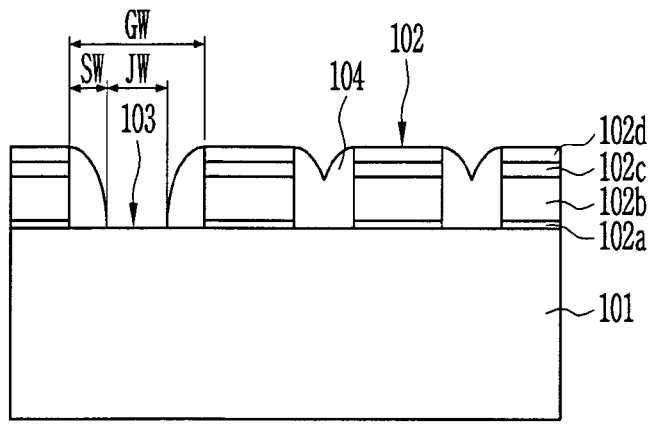
FIGS. 1A through 1D are sectional views illustrating a disclosed method of manufacturing a semiconductor device.
Figure 2:
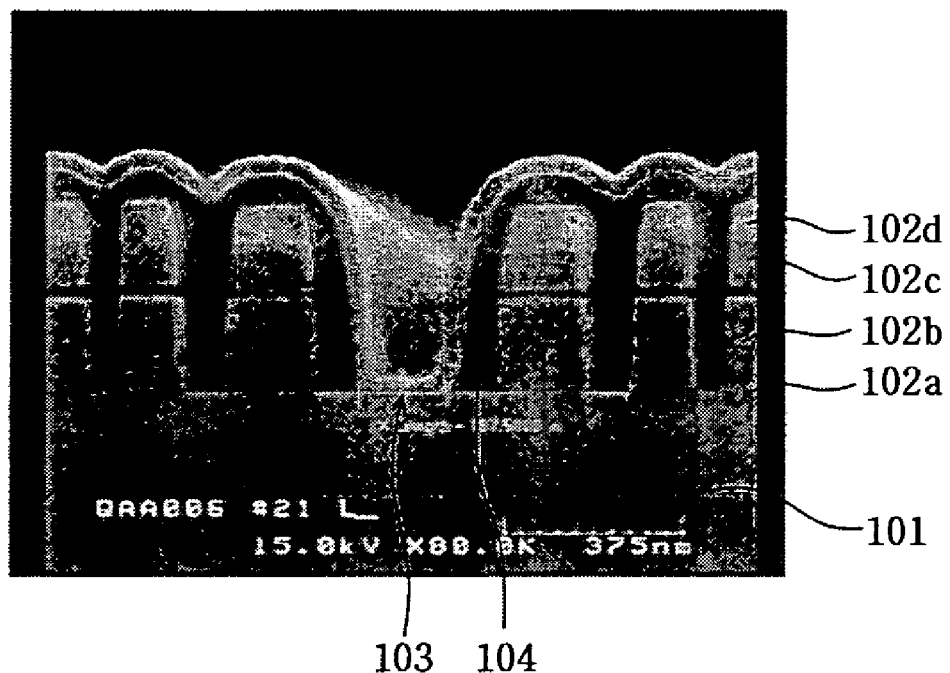
FIG. 2 is a microscopic view by SEM (scanning electron microscope) showing a section before etching insulation spacers.

Referring to FIGS. 1A and 2, gate lines 102 are formed on a semiconductor substrate 101 in a predetermined pattern. The gate line 102 may be formed with a stacked layer of a gate oxide layer 102*a*, a polysilicon layer 102*b*, a silicide layer 102*c*, and a hard mask 102*d*.

Then, junction areas 103 are defined on predetermined positions in the semiconductor substrate 101. The junction areas 103 may be formed by an ion implantation process, acting as sources/drains of transistors or memory cells.

After that, spacers 104 are formed on sidewalls of the gate lines 102. During this, the spacers 104 are formed of a silicon oxide layer thicker than a target thickness as regarding an etching portion in the consecutive process.

Since a thickness SW of the spacer 104 is high while a width GW of the gate line 102 is constant, an opening width JW of the junction area becomes narrow relative thereto.

Figure 1B:
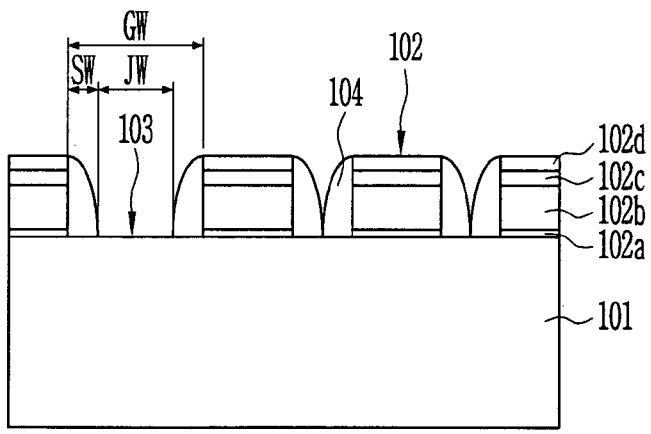

Referring to FIGS. 1B and 3, the insulation spacers 104 are partially etched away by a predetermined thickness by way of an etching process until the insulation spacers 104 reaches the target thickness thereof.

The etching process is desirable to be a wet etching process, using with a diluted HF solution as an etchant. Here, the diluted HF solution is made from mixing an HF solution with DI water in the ratio of 10:1 through 100:1. Otherwise, a BOE (Buffered Oxide Etchant) solution may be used in the wet etching process. And, it is preferred to control a time of the etching process in order to set the thickness SW of the insulation spacers 104 on the target thickness, regarding an etch ratio for the insulation spacers 104. For example, since the width GW of the gate line 102 is constant, the opening width JW increases when the thickness SW of the insulation spacer 104 decreases. Therefore, it needs to establish the target thickness of the insulation spacer 104 and then to manage the etching time so as to maximize the opening width JW of the junction area 103, within the scope of assuring the insulation layers 104 of a normal function. Practically, an amount of etching for the insulation spacers 104 is controllable to make the opening width JW of the junction areas 103 broader from 10 nm to 100 nm approximately.

Therefore, an aspect ratio of spaces between the gate lines 102 is decreased.

Figure 1C:
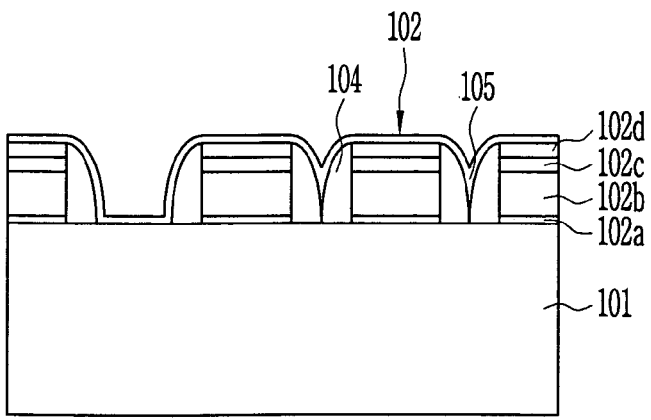

Referring to FIG. 1C, a nitride layer 105 is formed on the overall structure including the gate lines 102 to form borderless contacts.

Figure 1D:
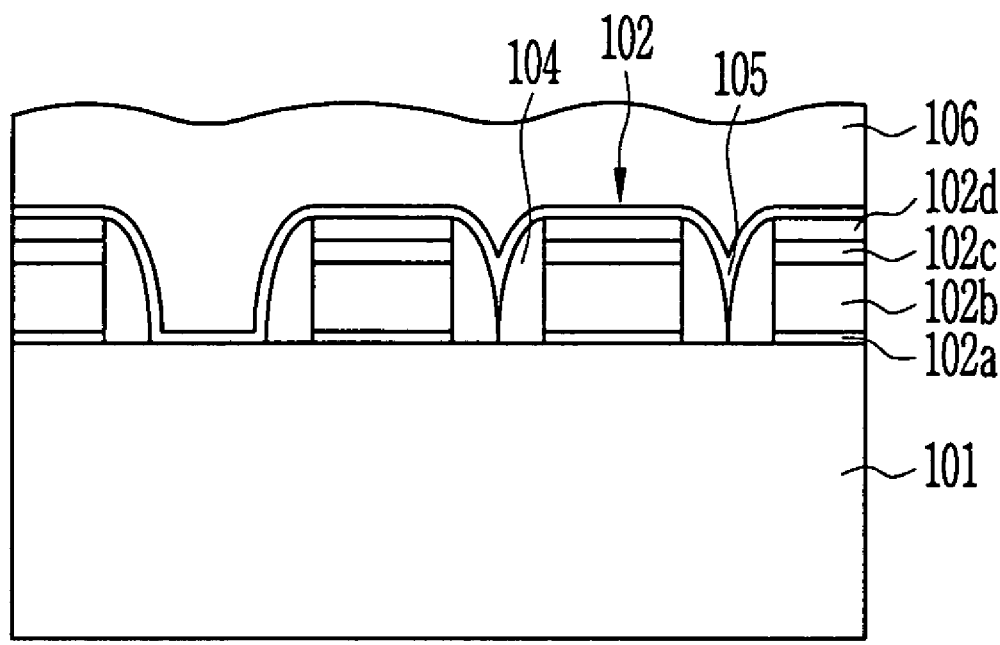

Referring to FIG. 1D, an interlayer insulating layer 106 is formed on the overall structure. As the interlayer insulating layer 106 is formed thereon after processing the reduced aspect ratio between the gate lines 102, it is possible to prevent voids from creating in the spaces between the gate lines 102.

Here, the interlayer insulating layer 106 may be formed of a high-density plasma oxide, preferably of a BPSG having good flexibility. During this, it is preferred to manage a ratio (wt %) of boron B and phosphorous P in the BPSG under 4.5 wt % and 4.0 wt %, respectively. Too much boron causes the number of particles or defects to be increased during evaporation, while too much phosphorous P may cause corrosion when filling a conductive material therein after forming the contacts.

After completing to form interlayer insulating layer 106, a rapid thermal process may be carried out to enhance the flexibility and the fill-up characteristic.

By the processes, the interlayer insulating layer 106 can be formed with preventing voids from creating in the spaces between the gate lines.

FIGS. 4A and 4B are microscopic views by SEM comparatively showing fill-up characteristics of the insulation layers in accordance with whether or not there is an etching process.

Referring FIG. 4A, it can be seen that there are voids in the spaces between the gate lines 102 when the interlayer insulating layer 106 has been formed therein without preparing enough spaces between the gate lines 102 because the insulation spacers 104 have not been etched in partial.

By the contrary, in the case of the present invention as illustrated in FIG. 4B, it can be seen that there are no voids in the spaces between the gate lines 102 which have been well filled by the conductive material therein, because the interlayer insulating layer 106 has been deposited therein after preparing the spaces by etching the insulation spacers 104 in a predetermined thickness.

As described above, the disclosed methods enhances the fill characteristics of insulation layers between the gate lines and improves the reliability of process and an electrical characteristic of device by controlling the opening widths of junction areas, by means of that an insulation spacer is formed thicker than a target thickness on sidewalls of a gate line formed on a semiconductor substrate and the thickness of the insulation spacer is adjusted by a wet etching process so as to make aspect ratios of spaces between gate lines become smaller to control opening widths of junction areas.

Although the disclosed methods have been described in connection with the embodiment illustrated in the accompanying drawings, it is not limited thereto. It will be apparent to those skilled in the art that various substitution, modifications and changes may be thereto without departing from the scope and spirit of this disclosure.

What is claimed is:

1. A method of manufacturing a semiconductor device, comprising the steps of:
   providing a semiconductor substrate;
   forming gate lines on the semiconductor substrate, wherein a first space and a second space narrower than the first space are disposed between the gate lines;
   forming a first junction area in the semiconductor substrate under the first space and forming a second junction area in the semiconductor substrate under the second space;
   forming insulation spacers on sidewalls of the gate lines, wherein a portion of the first area is exposed and the second junction area is covered with the insulation spacers;
   etching the insulation spacers, wherein an opening width of the first junction area is enlarged; and
   forming an interlayer insulating layer on the overall structure including the gate lines.

2. The method of claim 1, wherein the insulation spacers are formed of a silicon oxide layer.

3. The method of claim 1, wherein the etching is carried out with a wet etching process.

4. The method of claim 3, wherein the wet etching process is performed with a diluted HF solution or a BOE solution.

5. The method of claim 1, wherein the etching is adjusted to make the insulation spacers equal to a target thickness based on an etching ratio of the insulation spacers.

6. The method of claim 1, further comprising, before forming the interlayer insulating layer, the step of forming a nitride layer on the overall structure including the gate lines.

7. The method of claim 1, wherein the interlayer insulating layer is formed of a BPSG.

8. The method of claim 7, wherein the BPSG contains 4.5 wt % boron and 4.0 wt % phosphorous.

9. The method of claim 1, further comprising, after forming the interlayer insulating layer, the step of carrying out a rapid thermal process to increase flexibility of the interlayer insulating layer.

* * * * *